US012604112B2

(12) United States Patent
Murayama et al.

(10) Patent No.: US 12,604,112 B2
(45) Date of Patent: Apr. 14, 2026

(54) SEMICONDUCTOR CIRCUIT, IMAGING DEVICE, AND ELECTRONIC DEVICE

(71) Applicant: SONY SEMICONDUCTOR SOLUTIONS CORPORATION, Kanagawa (JP)

(72) Inventors: Shigemitsu Murayama, Kanagawa (JP); Yasuhide Shimizu, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 79 days.

(21) Appl. No.: 18/578,089

(22) PCT Filed: Mar. 30, 2022

(86) PCT No.: PCT/JP2022/015923
§ 371 (c)(1),
(2) Date: Jan. 10, 2024

(87) PCT Pub. No.: WO2023/007861
PCT Pub. Date: Feb. 2, 2023

(65) Prior Publication Data
US 2024/0334079 A1     Oct. 3, 2024

(30) Foreign Application Priority Data

Jul. 27, 2021     (JP) ................................. 2021-122837

(51) Int. Cl.
*H04N 25/60*       (2023.01)
*H03M 1/08*       (2006.01)
(Continued)

(52) U.S. Cl.
CPC .............. *H04N 25/60* (2023.01); *H03M 1/08* (2013.01); *H04N 25/709* (2023.01); *H04N 25/77* (2023.01)

(58) Field of Classification Search
CPC ...... H04B 25/60; H04N 25/709; H04N 25/77; H04N 25/78; H04N 25/60; H03M 1/08; H03M 1/12; H03K 17/00
See application file for complete search history.

(56) References Cited

U.S. PATENT DOCUMENTS 10,157,578 B2 * 12/2018 Kikuchi .............. H03M 1/1014
2010/0117882 A1 * 5/2010 Tsukamoto ......... H03M 1/0863
341/155
(Continued)

FOREIGN PATENT DOCUMENTS

JP          04-044700 A       2/1992
JP          H0444700 A   *   2/1992   ............. G11C 27/02
(Continued)

OTHER PUBLICATIONS

International Search Report and Written Opinion of PCT Application No. PCT/JP2022/015923, issued on Jun. 21, 2022, 11 pages of ISRWO.

*Primary Examiner* — Marly S Camargo
(74) *Attorney, Agent, or Firm* — CHIP LAW GROUP

(57)          ABSTRACT

Provided is a semiconductor circuit that includes a first transistor that switches whether to acquire an input signal into a first node, a second transistor having at least one of a source and a drain that are connected to the first node, and a third transistor that switches whether the first node and a second node are to be electrically short-circuited or cut off from each other, wherein the state of the second transistor makes a transition to have a gate waveform opposite in phase to the gate waveform of a first transistor after the timing of a transition of the first transistor from an on-state (Continued)

1: SEMICONDUCTOR CIRCUIT to an off-state, and the third transistor makes a transition from an on-state to an off-state after the timing of the state transition of the second transistor.

20 Claims, 12 Drawing Sheets

(51) Int. Cl.
*H04N 25/709* (2023.01)
*H04N 25/77* (2023.01)

(56) References Cited

U.S. PATENT DOCUMENTS

| | | | | |
|---|---|---|---|---|
| 2011/0115959 | A1* | 5/2011 | Toyama ................ | H04N 25/76 |
| | | | | 348/308 |
| 2013/0057420 | A1* | 3/2013 | Oku .................... | H03M 1/0604 |
| | | | | 341/136 |
| 2023/0300485 | A1* | 9/2023 | Nakagawa .............. | H03M 1/56 |

FOREIGN PATENT DOCUMENTS

| | | | | | |
|---|---|---|---|---|---|
| JP | 2010-118931 | A | | 5/2010 | |
| JP | 2011-109282 | A | | 6/2011 | |
| JP | 2013191911 | A | * | 9/2013 | ........... H03K 17/687 |

* cited by examiner

1: SEMICONDUCTOR CIRCUIT

1a: SEMICONDUCTOR CIRCUIT

1b: SEMICONDUCTOR CIRCUIT

1c: SEMICONDUCTOR CIRCUIT

1d: SEMICONDUCTOR CIRCUIT

1e: SEMICONDUCTOR CIRCUIT

1f: SEMICONDUCTOR CIRCUIT

1g: SEMICONDUCTOR CIRCUIT

1h: SEMICONDUCTOR CIRCUIT

1: SEMICONDUCTOR CIRCUIT

1: SEMICONDUCTOR CIRCUIT

1k: SEMICONDUCTOR CIRCUIT

1m: SEMICONDUCTOR CIRCUIT

1n: SEMICONDUCTOR CIRCUIT

11: IMAGING DEVICE

SEMICONDUCTOR CIRCUIT, IMAGING DEVICE, AND ELECTRONIC DEVICE

CROSS REFERENCE TO RELATED APPLICATIONS

This application is a U.S. National Phase of International Patent Application No. PCT/JP2022/015923 filed on Mar. 30, 2022, which claims priority benefit of Japanese Patent Application No. JP 2021-122837 filed in the Japan Patent Office on Jul. 27, 2021. Each of the above-referenced applications is hereby incorporated herein by reference in its entirety.

TECHNICAL FIELD

The present disclosure relates to a semiconductor circuit, an imaging device, and an electronic device.

BACKGROUND ART

A bias voltage may fluctuate due to noise from a circuit for generating a bias voltage used for a current source or the like or noise entering from another circuit using a bias voltage. In order to prevent fluctuations in bias voltage, a circuit may be provided for the sample and hold of a bias voltage. For the sample and hold of a bias voltage, a switch for sample and hold is necessary.

When a switch for sample and hold is switched from an on-state to an off-state, a bias voltage may fluctuate due to charge injection or clock feedthrough. To address the problem, a switch for cancellation may be provided (see PTL 1).

CITATION LIST

Patent Literature

[PTL 1]
JP 2010-118931A

SUMMARY

Technical Problem

However, if the switch for cancellation is provided, the switch may act as a capacitance connected to the ground and cause power supply noise to propagate to a circuit of the subsequent stage during the hold of a bias voltage.

Hence, the present disclosure provides a semiconductor circuit, an imaging device, and an electronic device that improve resistance to power supply noise.

Solution to Problem

In order to solve the problem, the present disclosure provides a semiconductor circuit including: a first transistor that switches whether to acquire an input signal into a first node;

a second transistor having at least one of the source and the drain that are connected to the first node; and a third transistor that switches whether the first node and a second node are to be electrically short-circuited or cut off from each other, wherein the state of the second transistor makes a transition to have a gate waveform opposite in phase to the gate waveform of the first transistor after the timing of a transition of the first transistor from an on-state to an off-state, and the third transistor makes a transition from an on-state to an off-state after the timing of the state transition of the second transistor.

The semiconductor device may further include a cancelling switch that includes the second transistor and cancels potential fluctuations of the first node, the potential fluctuations being caused by charge injection and clock feedthrough when the first transistor makes a transition from an on-state to an off-state.

The drain of the first transistor may be connected to the first node, and the input signal may be inputted to the source of the first transistor.

The first transistor and the third transistor may be PMOS (P-channel Metal-Oxide-Semiconductor) transistors, if the second transistor is a PMOS transistor, the second transistor may make a transition from an off-state to an on-state after the timing of the transition of the first transistor from the on-state to the off-state, and the third transistor may make a transition from an on-state to an off-state after the timing of the transition of the second transistor from the off-state to the on-state, and if the second transistor is an NMOS (N-channel Metal-Oxide-Semiconductor) transistor, the second transistor may make a transition from an on-state to an off-state after the timing of the transition of the first transistor from the on-state to the off-state, and the third transistor may make the transition from the on-state to the off-state after the timing of a transition of the second transistor from the on-state to the off-state.

The drain of the first transistor may be connected to the second node, and the input signal may be inputted to the source of the first transistor.

The first transistor and the third transistor may be NMOS (N-channel Metal-Oxide-Semiconductor) transistors, if the second transistor is a NMOS transistor, the second transistor may make a transition from an off-state to an on-state after the timing of the transition of the first transistor from the on-state to the off-state, and the third transistor may make a transition from an on-state to an off-state after the timing of a transition of the second transistor from the off-state to the on-state, and if the second transistor is a PMOS transistor, the second transistor may make a transition from an on-state to an off-state after the timing of the transition of the first transistor from the on-state to the off-state, and the third transistor may make the transition from the on-state to the off-state after the timing of a transition of the second transistor from the on-state to the off-state.

After the third transistor makes a transition from an on-state to an off-state, the second node may be set at a potential independent of the gate potential of the second transistor.

The semiconductor circuit may include a fourth transistor having the gate connected to the second node; and a capacitor connected between the gate of the fourth transistor and a reference potential node.

The capacitor may hold a charge corresponding to the input signal at the timing of the transition of the first transistor from the on-state to the off-state.

The capacitor may be connected between the second node and the third node, and when the third transistor is turned off, the gate potential of the third transistor may be set at the potential of the third node.

The source of the fourth transistor may be connected to a signal line that transmits a pixel signal.

The semiconductor circuit may further include a current source including the fourth transistor.

The semiconductor circuit may further including a differential amplifier including: a fifth transistor constituting a differential pair with the fourth transistor, and a sixth transistor that controls a current applied between the drains and sources of the fourth transistor and the fifth transistor.

The first transistor, the second transistor, and the third transistor may have the same conductivity type.

The conductivity type of the first transistor and the third transistor and the conductivity type of the second transistor may be different from each other.

The sources of the first transistor and the second transistor may be connected to each other, and the drains of the first transistor and the second transistor may be connected to each other.

The semiconductor circuit may further include a switching control circuit that causes the state of the second transistor to make a transition after the timing of the transition of the first transistor from the on-state to the off-state, and the switching control circuit causes the third transistor to make a transition from an on-state to an off-state after the timing of the state transition of the second transistor.

The present disclosure provides an imaging device including: a pixel array part configured such that a plurality of pixels having a plurality of photoelectric conversion units are two-dimensionally arranged;

a plurality of signal lines that transmit pixel signals photoelectrically converted in the plurality of pixels in the pixel array part;

an internal voltage generation circuit that generates a bias voltage;

a sample hold circuit that samples and holds the bias voltage with a predetermined period;

a current source that controls a current passing through the plurality of signal lines, on the basis of the bias voltage held by the sample hold circuit; and an AD converter that generates a plurality of digital signals corresponding to the plurality of pixel signals on the basis of the results of comparison between the pixel signals on the plurality of signal lines and a reference signal, the sample hold circuit including:

a first transistor that switches whether to acquire the bias voltage into a first node;

a second transistor having at least one of the source and the drain that are connected to the first node; and a third transistor that switches whether the first node and a second node are to be electrically short-circuited or cut off from each other, wherein the state of the second transistor makes a transition to have a gate waveform opposite in phase to the gate waveform of the first transistor after the timing of a transition of the first transistor from an on-state to an off-state, and the third transistor makes a transition from an on-state to an off-state after the timing of the state transition of the second transistor.

The current source may include a plurality of fourth transistors corresponding to the plurality of signal lines, and the drains of the plurality of fourth transistors may be connected to the respective signal lines.

An electronic device is provided, the electronic device including the imaging device; and a signal processing unit that performs signal processing on the basis of the plurality of digital signals outputted from the imaging device.

DESCRIPTION OF EMBODIMENTS

Embodiments of a semiconductor circuit, an imaging device, and an electronic device will be described below with reference to the drawings. Hereinafter, the main components of the semiconductor circuit, the imaging device, and the electronic device will be mainly described. The semiconductor circuit, the imaging device, and the electronic device may include components and functions that are not illustrated or described. The following description does not exclude components or functions that are not illustrated or described.

The semiconductor circuit according to the present disclosure is predicated on the provision of a switch for cancellation as a measure against charge injection and clock feedthrough that may cause problems in a switch for sample and hold. The provision of a switch for cancellation may cause power supply noise to propagate through a circuit of the subsequent stage. Variations of the semiconductor circuit configured to address the problem will be sequentially described below.

First Embodiment

Figure 1:
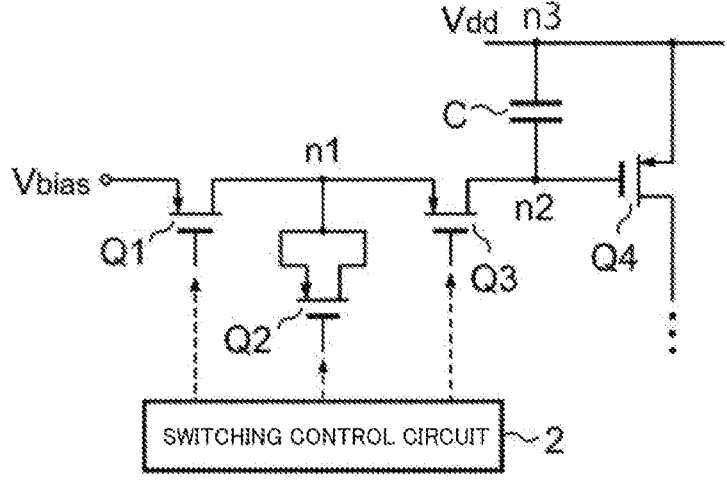
FIG. 1 is a circuit diagram of a semiconductor circuit according to a first embodiment.
Figure 2:
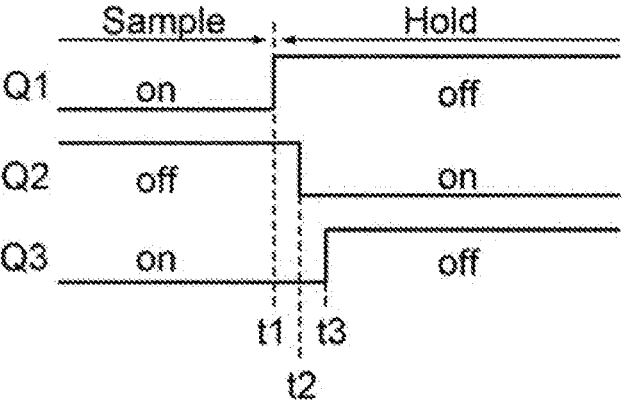
FIG. 2 is an operation timing chart of the semiconductor circuit of FIG. 1.

FIG. 1 is a circuit diagram of a semiconductor circuit 1 according to a first embodiment. FIG. 2 is an operation timing chart of the semiconductor circuit 1 in FIG. 1. The semiconductor circuit 1 of FIG. 1 has the function of sampling and holding an inputted bias voltage. The semiconductor circuit 1 of FIG. 1 includes a first transistor Q1, a second transistor Q2, and a third transistor Q3 as essential components. The semiconductor circuit 1 of FIG. 1 further includes a fourth transistor Q4 and a hold capacitor C. The fourth transistor Q4 and the hold capacitor C are not always necessary.

The first transistor Q1 is a switch for sample and hold and switches whether to acquire an input signal (bias voltage Vbias) into a first node n1 or not. More specifically, the bias voltage Vbias is supplied to the source of the first transistor Q1, and a first node n1 is connected to the drain of the first transistor Q1. When the first transistor Q1 is turned on, the bias voltage Vbias is drawn into the first node n1 (sample period), whereas when the first transistor Q1 is turned off, a charge corresponding to the drawn bias voltage Vbias is held in the hold capacitor C (hold period). The first transistor Q1 configured with a PMOS transistor in FIG. 1 may be configured with an NMOS transistor as will be described later.

The second transistor Q2 has the source and the drain that are connected to the first node n1. In other words, the source and the drain of the second transistor Q2 are electrically connected to the drain of the first transistor Q1. The second transistor Q2 acts as a cancelling switch that cancels potential fluctuations of the first node n1, the potential fluctuations being caused by charge injection and clock feedthrough when the first transistor Q1 makes a transition from an on-state to an off-state. The second transistor Q2 configured with a PMOS transistor in FIG. 1 may be configured with an NMOS transistor as will be described later.

As shown in FIG. 2, the state of the second transistor Q2 makes a transition to have a gate waveform opposite in phase to the gate waveform of the first transistor Q1 after timing t1 of a transition of the first transistor Q1 from an on-state to an off-state. In this way, the gate waveform of the first transistor Q1 and the gate waveform of the second transistor Q2 are opposite in phase, allowing the channel of the second transistor Q2 to absorb charge generated by charge injection or clock feedthrough when the first transistor Q1 is turned off, as will be described later.

The third transistor Q3 switches whether the first node n1 and a second node n2 are to be electrically short-circuited or cut off. When the third transistor Q3 is turned on, the first node n1 and the second node n2 are electrically short-circuited. When the third transistor Q3 is turned off, the first node n1 and the second node n2 are electrically cut off from each other. The third transistor Q3 configured with a PMOS transistor in FIG. 1 may be configured with an NMOS transistor as will be described later. In the example of FIG. 1, the gate of the fourth transistor Q4 and one end of the hold capacitor C are connected to the second node n2. A circuit configuration connected to the second node n2 is not taken into consideration except for the drain of the third transistor Q3. The third transistor Q3 makes a transition from an on-state to an off-state after the timing of the state transition of the second transistor Q2. After the third transistor Q3 makes a transition from an on-state to an off-state, the second node n2 is set at a potential independent of the gate of the second transistor Q2.

As described above, the first to third transistors Q1 to Q3 in FIG. 1 are all PMOS transistors. Thus, the transistors are turned on when the gates are placed at a low level, whereas the transistors are turned off when the gates are placed at a high level.

In the absence of the second transistor Q2 as a switch for cancellation, the potential of the first node n1 may fluctuate due to charge injection and clock feedthrough when the first transistor Q1, which serves as a switch for sample and hold, changes from an on-state to an off-state.

Charge injection indicates that charge (positive hole or electron) accumulated in a channel in an on-state of the transistor moves to the source or the drain of the transistor in a transition from an on-state to an off-state and thus changes the potential of the source or the drain. Clock feedthrough indicates that a drain or source voltage is changed due to an electrostatic effect caused by a parasitic capacitance between the gate and the drain or between the gate and the source when the transistor makes a transition from an on-state to an off-state.

As shown in FIG. 2, the gate waveform of the second transistor Q2 serving as a switch for cancellation is opposite in phase to the gate waveform of the first transistor Q1 serving as a switch for sample and hold. Thus, when the first transistor Q1 makes a transition from an on-state to an off-state, charge generated at the source or the drain by charge injection or clock feedthrough can be absorbed by the channel of the second transistor Q2, thereby suppressing fluctuations in the potential of the first node n1, the fluctuations being caused by charge injection or clock feedthrough.

More specifically, clock feedthrough is caused by fluctuations in the gate potential of the first transistor Q1 and thus the influence of clock feedthrough can be cancelled by setting the gate potential of the second transistor Q2 in opposite phase to the gate potential of the first transistor.

If the first transistor Q1 is a PMOS transistor, charge injection is caused by ejecting a positive hole in the channel when the first transistor Q1 is turned off. If the second transistor Q2 is a PMOS transistor, a positive hole ejected from the channel of the first transistor Q1 can be absorbed by the channel of the second transistor Q2 by turning on the second transistor Q2. If the second transistor Q2 is an NMOS transistor, by turning off the second transistor Q2, an electron can be ejected from the channel of the second transistor Q2 and can be cancelled out with a positive hole ejected from the channel of the first transistor Q1.

Figure 3:
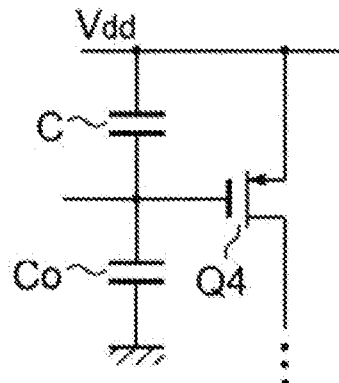
FIG. 3 is an equivalent circuit diagram of the semiconductor circuit in which a third transistor is omitted.

As shown in FIG. 2, the third transistor Q3 makes a transition from an on-state to an off-state after timing t2 of the state transition of the second transistor Q2 (timing t3). If the third transistor Q3 is omitted, the source and the drain of the second transistor Q2 are connected to the gate of the fourth transistor Q4 and one end of the hold capacitor C. Thus, if the gate of the second transistor Q2 is lowered to a ground potential to turn on the second transistor Q2, a capacitor Co formed between the source and the drain of the second transistor Q2 and a ground node is connected to the gate of the fourth transistor Q4 as shown in the equivalent circuit of FIG. 3. In this state, the hold capacitor C and the capacitor Co are connected in series between a power supply node and the ground node. Thus, the gate of the fourth transistor Q4 has a voltage level obtained by a capacitance division of a power supply voltage Vdd by the hold capacitor C and the capacitor Co.

For example, when the voltage level of the power supply voltage Vdd is changed by power supply noise, the gate voltage of the fourth transistor Q4 fluctuates at a voltage level obtained by a capacitance division of the power supply voltage Vdd. Since the voltage fluctuation of the power supply voltage Vdd and the voltage fluctuation of the gate voltage of the fourth transistor Q4 are different from each other, a voltage between the gate and the source of the fourth transistor Q4 may change according to the voltage fluctuations of the power supply voltage Vdd and adversely affect a circuit of the subsequent stage.

To address the problem, the third transistor Q3 is provided as in the semiconductor circuit 1 of FIG. 1 and the third transistor Q3 is caused to make a transition from an on-state to an off-state after the timing t2 of the state transition of the second transistor Q2. Thus, the gate voltage of the fourth transistor Q4 is not affected by the equivalent capacity of the second transistor Q2. In other words, when the third transistor Q3 is turned off, only the hold capacitor C is connected to the gate of the fourth transistor Q4 and the capacitor Co formed between the source and the drain of the second transistor Q2 and the ground node is interrupted by the third transistor Q3. Thus, when the voltage level of the hold capacitor C is changed by power supply noise, the gate voltage of the fourth transistor Q4 also fluctuates with the same fluctuation via the hold capacitor C. Therefore, a voltage between the gate and the source of the fourth transistor Q4 is not affected by voltage fluctuations of the power supply voltage, thereby improving resistance to noise. When the third transistor Q3 is turned off, a gate voltage is desirably set at the same potential as the potential (Vdd in FIG. 1) of another end (third node) n3 of the hold capacitor C. This is because even if the influence of the capacitor Co formed between the source and the drain of the second transistor Q2 and the ground node is interrupted by the third transistor Q3, when the gate potential of the third transistor Q3 is different from the potential of the third node n3, the gate potential of the fourth transistor Q4 is affected by fluctuations of the power supply voltage Vdd due to a capacitance division by a capacitor formed between the gate of the third transistor Q3 and the second node n2 and the hold capacitor C.

The on-off control of first and second transistors Q1 and Q2 of FIG. 1 and the third transistor Q3 can be performed by, for example, a switching control circuit 2. The switching control circuit 2 causes the second transistor Q2 to make a transition from an off-state to an on-state after the timing of a transition of the first transistor Q1 from an on-state to an off-state, and the switching control circuit 2 causes the third transistor Q3 to make a transition from an on-state to an off-state after the timing of a transition of the second transistor Q2 from an off-state to an on-state.

The switching control circuit 2 may be provided in the semiconductor circuit 1 as illustrated in FIG. 1 or may be separated from the semiconductor circuit 1 of FIG. 1 such that a gate control signal outputted from the switching control circuit 2 is inputted to the gates of the first to third transistors Q1 to Q3 in the semiconductor circuit 1 of FIG. 1.

In FIG. 2, the second transistor Q2 makes a transition from an off-state to an on-state (timing t2) after the timing t1 of a transition of the first transistor Q1 from an on-state to an off-state. The timing t2 of a transition of the second transistor Q2 from an off-state to an on-state may be the same timing as t1.

Moreover, in FIG. 2, the third transistor Q3 makes a transition from an on-state to an off-state (timing t3) after the timing t2 of a transition of the second transistor Q2 from an off-state to an on-state. The timing t3 of a transition of the third transistor Q3 from an off-state to an on-state may be the same timing as t2.

The circuit configuration of the semiconductor circuit 1 in FIG. 1 can be modified in various ways. Hereinafter, some representative modification examples will be described. The present disclosure is not limited to the modification examples.

Figure 4:
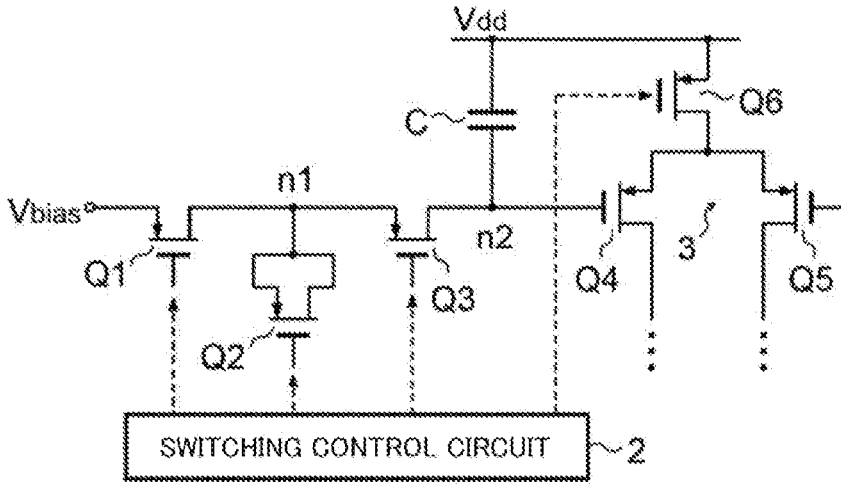
FIG. 4 is a circuit diagram of a semiconductor circuit according to a first modification example of the first embodiment.

FIG. 4 is a circuit diagram of a semiconductor circuit 1a according to a first modification example of the first embodiment. The semiconductor circuit 1a in FIG. 4 is configured such that the fourth transistor Q4 is replaced with a differential amplifier 3. The differential amplifier 3 in the semiconductor circuit 1a of FIG. 4 includes the fourth transistor Q4 and a fifth transistor that constitute a differential pair and a sixth transistor Q6 constituting a current source connected to the differential pair. The fourth to sixth transistors Q4 to Q6 configured with PMOS transistors in FIG. 4 may be configured with NMOS transistors as will be described later.

As in the semiconductor circuit 1 of FIG. 1, the gate of the fourth transistor Q4 is connected to the second node n2 and the hold capacitor C is also connected between the second node n2 and a power-supply voltage node Vdd. The source of the fourth transistor Q4 and the source of the fifth transistor are connected to the drain of the sixth transistor Q6, and the source of the sixth transistor Q6 is connected to the power supply voltage node Vdd. The semiconductor circuit 1a of FIG. 4 operates with the same operation timing as in FIG. 2.

Figure 5:
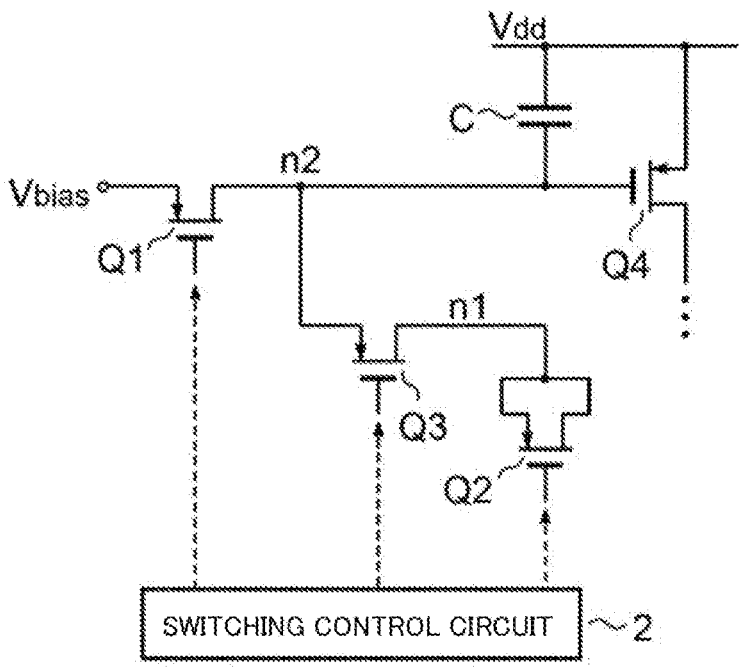
FIG. 5 is a circuit diagram of a semiconductor circuit according to a second modification example of the first embodiment.

FIG. 5 is a circuit diagram of a semiconductor circuit 1b according to a second modification example of the first embodiment. The semiconductor circuit 1b in FIG. 5 is different from FIG. 1 in the connection location of the second transistor Q2. Unlike in FIGS. 1 and 4, the drain of the first transistor Q1 in the semiconductor circuit 1b of FIG. 5 is not connected to the first node n1 but is connected to the second node n2. In the semiconductor circuit 1b of FIG. 5, an input signal (bias voltage Vbias) is supplied to the source of the first transistor Q1 as in FIGS. 1 and 4.

The drain of the third transistor Q3 is connected to the first node n1 to which the source and the drain of the second transistor Q2 in the semiconductor circuit 1b of FIG. 5 are connected, and the source of the third transistor Q3 is connected to the second node n2. The fourth transistor Q4 and the hold capacitor C in the semiconductor circuit 1b of FIG. 5 have a connection relationship in common with the semiconductor circuit 1 of FIG. 1.

The semiconductor circuit 1b of FIG. 5 operates with the same operation timing as in FIG. 2. The third transistor Q3 makes a transition from an on-state to an off-state after the second transistor Q2 makes a transition from an off-state to an on-state. When the third transistor Q3 is turned off, the capacitor Co formed between the source and the drain of the second transistor Q2 in an off-state and the ground node is shut off from the gate of the fourth transistor Q4. Thus, even if a power supply voltage fluctuates, a voltage between the gate and the source of the fourth transistor Q4 can be kept constant.

Figure 6:
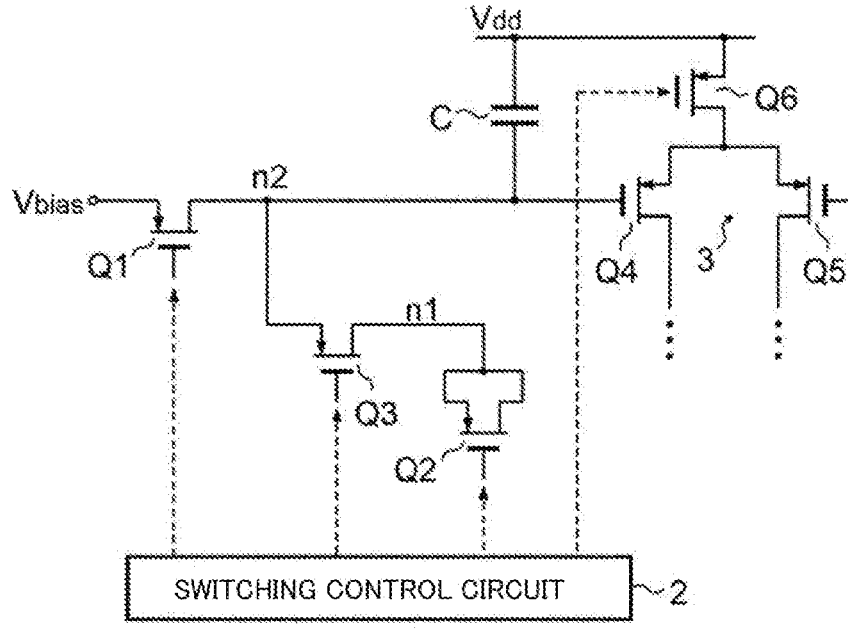
FIG. 6 is a circuit diagram of a semiconductor circuit according to a third modification example of the first embodiment.

FIG. 6 is a circuit diagram of a semiconductor circuit 1c according to a third modification example of the first embodiment. The semiconductor circuit 1c in FIG. 6 is configured such that the fourth transistor Q4 in the semiconductor circuit 1b of FIG. 5 is replaced with the differential amplifier 3 configured as in FIG. 4. The semiconductor circuit 1c in FIG. 6 performs circuit operations in common with FIG. 5 and thus a description of the circuit operations is omitted.

In the semiconductor circuits 1, 1a, 1b, and 1c of FIGS. 1 to 6, some of the first to third transistors Q1 to Q3 configured with PMOS transistors may be configured with NMOS transistors.

Figure 7:
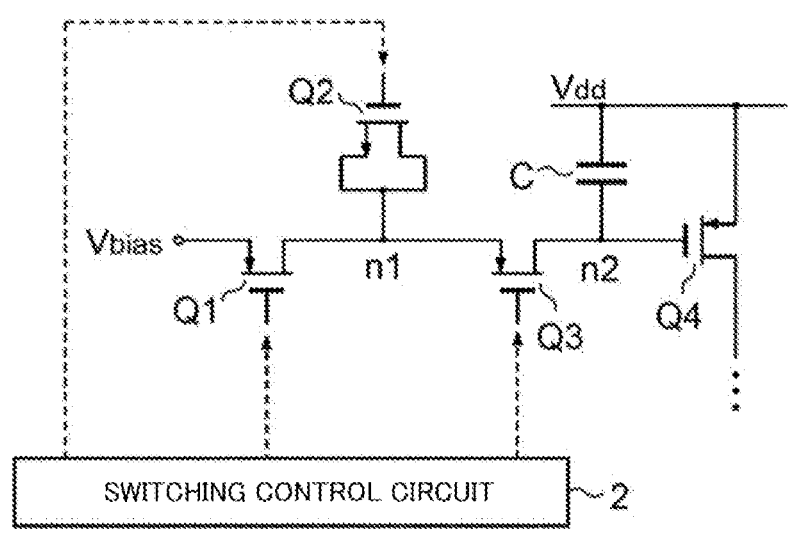
FIG. 7 is a circuit diagram of a semiconductor circuit according to a fourth modification example of the first embodiment.

FIG. 7 is a circuit diagram of a semiconductor circuit 1d according to a fourth modification example of the first embodiment. In the semiconductor circuit 1d in FIG. 7, the conductivity type of the second transistor Q2 in the semiconductor circuit 1 of FIG. 1 is reversed. In the semiconductor circuit 1d of FIG. 7, the second transistor Q2 is an NMOS transistor and the first transistor Q1 and the third transistor Q3 are PMOS transistors.

Figure 8:
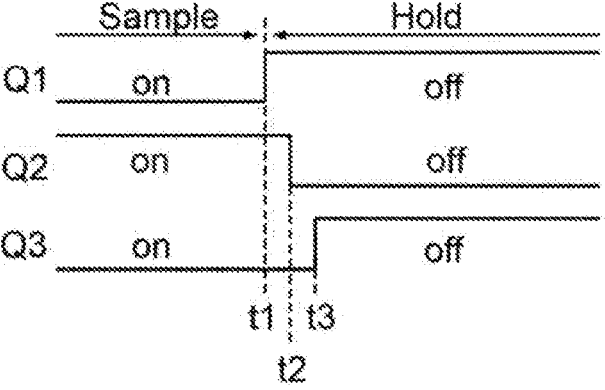
FIG. 8 is an operation timing chart of the semiconductor circuit of FIG. 7.

FIG. 8 is an operation timing chart of the semiconductor circuit 1d in FIG. 7. As shown in FIG. 8, the gate waveform of the second transistor Q2 is identical to that of FIG. 2 and is opposite in phase to the gate waveform of the first transistor Q1, though the conductivity type of the second transistor Q2 is reversed from that of FIG. 1. In the semiconductor circuit 1 of FIG. 1, the transistor Q1 is placed in an on-state and the transistor Q2 is placed in an off-state during a sample period, whereas in the semiconductor circuit 1d of FIG. 7, the transistors Q1 and Q2 are both placed in an on-state. Thereafter, the transistor Q2 makes a transition from an on-state to an off-state (timing t2) after the timing t1 of a transition of the transistor Q1 from an on-state to an off-state and enters a hold period. After the timing t2, the third transistor Q3 makes a transition from an on-state to an off-state (timing t3). As described above, if the first transistor Q1 and the third transistor Q3 are PMOS transistors and the second transistor Q2 is an NMOS transistor, by turning off the first transistor Q1 and the second transistor Q2, an electron ejected from the channel of the second transistor Q2 and a positive hole ejected from the channel of the first transistor Q1 can be cancelled out, thereby suppressing potential fluctuations of the first node n1, the potential fluctuations being caused by charge injection or clock feedthrough.

As described above, in the semiconductor circuit 1d of FIG. 7, the conductivity type of the second transistor Q2 is reversed from that of the semiconductor circuit 1 of FIG. 1. However, the gate waveform of the first transistor Q1 and the gate waveform of the second transistor Q2 are opposite in phase as in the semiconductor circuit 1 of FIG. 1. Also in the semiconductor circuit 1d of FIG. 7, the third transistor Q3 is provided, so that a voltage between the gate and the source of the fourth transistor Q4 is not affected by fluctuations of the power supply voltage.

Figure 9:
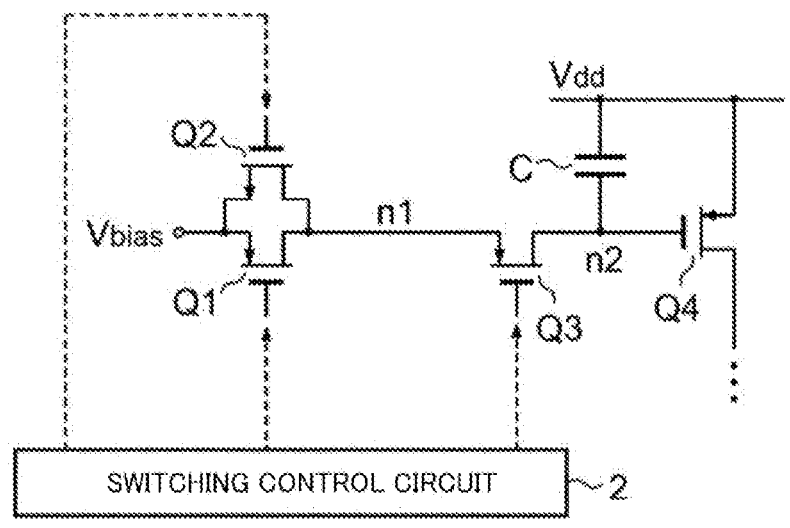
FIG. 9 is a circuit diagram of a semiconductor circuit according to a fifth modification example of the first embodiment.

FIG. 9 is a circuit diagram of a semiconductor circuit 1e according to a fifth modification example of the first embodiment. The semiconductor circuit 1e in FIG. 9 is configured such that the second transistor Q2 is an NMOS transistor as in FIG. 7. In the semiconductor circuit 1e of FIG. 9, the first transistor Q1 and the second transistor Q2 are connected in parallel between the input node of the bias voltage Vbias and the first node n1. In other words, the sources of the first transistor Q1 and the second transistor Q2 are connected to each other, and the drains thereof are connected to each other. Thus, a positive hole ejected from the channel in an off-state of the first transistor Q1 and an electron ejected from the channel in an off-state of the second transistor Q2 can be cancelled out. The semiconductor circuit 1e in FIG. 9 has operation timing in common with FIG. 8.

Figure 10:
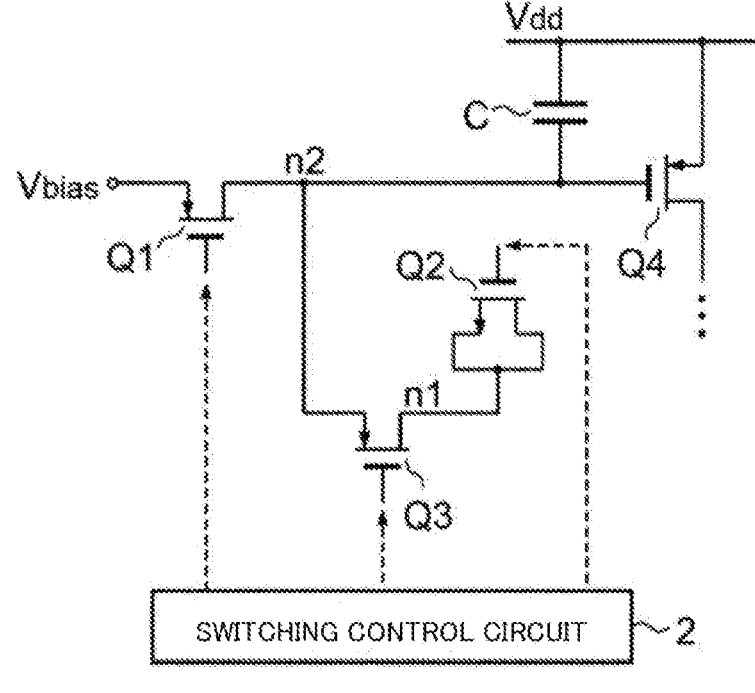
FIG. 10 is a circuit diagram of a semiconductor circuit according to a sixth modification example of the first embodiment.

FIG. 10 is a circuit diagram of a semiconductor circuit 1f according to a sixth modification example of the first embodiment. The semiconductor circuit 1f in FIG. 10 is configured such that the second transistor Q2 is an NMOS transistor as in FIG. 7. In the semiconductor circuit 1f of FIG. 10, the drain of the third transistor Q3 is connected to the first node n1 to which the source and the drain of the second transistor Q2 are connected, and the source of the third transistor Q3 is connected to the second node n2.

As described above, in the semiconductor circuits 1, 1a, 1b, 1c, and 1d according to the first embodiment, the third transistor Q3 is connected between the first node n1, to which at least one of the source and the drain of the second transistor Q2 serving as a switch for cancellation is connected, and the second node n2 connected to the gate of the fourth transistor Q4. By turning off the third transistor Q3 after the state transition of the second transistor Q2, a voltage between the gate and the source of the fourth transistor Q4 is not affected by fluctuations in power supply voltage, thereby improving resistance to noise.

Second Embodiment

The first embodiment described an example in which the first transistor Q1 and the third transistor Q3 are PMOS transistors. A second embodiment will describe an example in which a first transistor Q1 and a third transistor Q3 are NMOS transistors.

Figure 11:
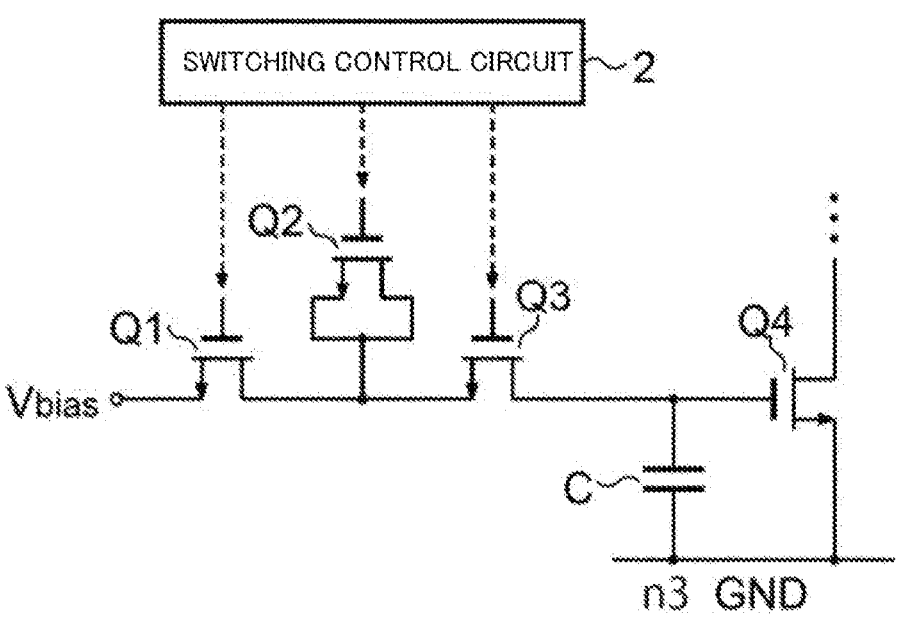
FIG. 11 is a circuit diagram of a semiconductor circuit according to a second embodiment.
Figure 12:
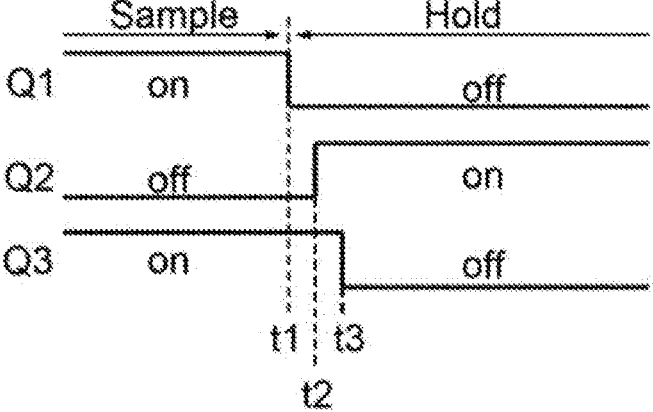
FIG. 12 is an operation timing chart of the semiconductor circuit of FIG. 11.

FIG. 11 is a circuit diagram of a semiconductor circuit 1g according to the second embodiment. FIG. 12 is an operation timing chart of the semiconductor circuit 1g in FIG. 11. In the semiconductor circuit 1g in FIG. 11, the conductivity types of first to fourth transistors Q1 to Q4 are reversed unlike in the semiconductor circuit 1 of FIG. 1. The first to fourth transistors Q1 to Q4 in FIG. 11 are configured with NMOS transistors. The source of the fourth transistor Q4 and another end n3 of a hold capacitor C are connected to a ground node.

In the semiconductor circuit 1g of FIG. 11, the first transistor Q1 is caused to make a transition from an on-state to an off-state by switching the gate of the first transistor Q1 from a high level to a low level (timing t1), and a bias voltage Vbias is held in the hold capacitor C. By switching the gate of the second transistor Q2 from the low level to the high level after the timing t1 after the timing t1, the second transistor Q2 is caused to make a transition from an off-state to an on-state (timing t2), allowing the channel of the second transistor Q2 to absorb charge generated through charge injection and clock feedthrough that are caused by turning off the first transistor Q1. By switching the gate of the third transistor Q3 from the high level to the low level after the timing t2, the third transistor Q3 is caused to make a transition from an on-state to an off-state (timing t3), so that a capacitor formed between the source and the drain of the third transistor Q3 and a power-supply voltage node Vdd can be shut off from the gate of the fourth transistor Q4.

Thus, in the semiconductor circuit 1g according to the second embodiment, even if a power supply voltage fluctuates, a voltage between the gate and the source of the fourth transistor is not affected by fluctuations in power supply voltage as in the first embodiment, thereby improving resistance to noise.

Also in the semiconductor circuit 1g of FIG. 11, the circuit configuration may be modified in various manners. Hereinafter, representative modification examples will be sequentially described.

Figure 13:
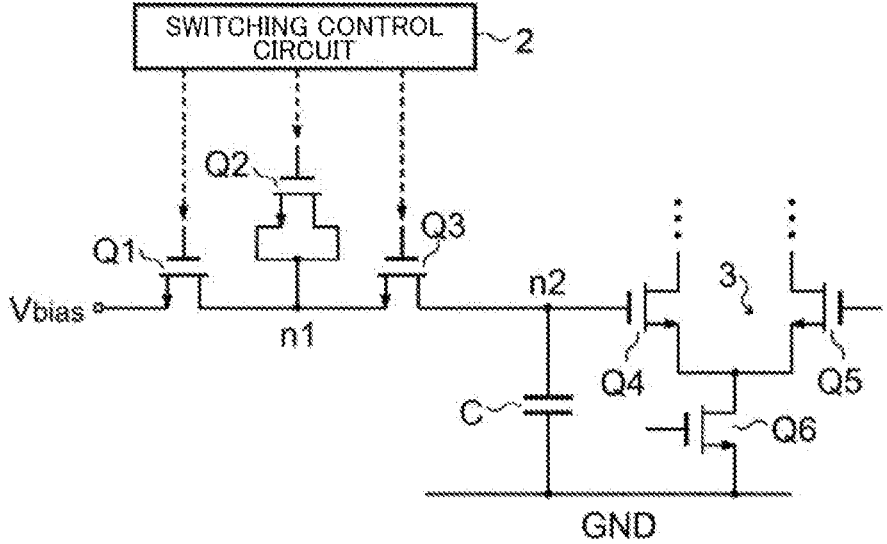
FIG. 13 is a circuit diagram of a semiconductor circuit according to a first modification example of the second embodiment.

FIG. 13 is a circuit diagram of a semiconductor circuit 1h according to a first modification example of the second embodiment. The semiconductor circuit 1h in FIG. 13 is configured such that the fourth transistor Q4 is replaced with a differential amplifier 3. The differential amplifier 3 is configured with fourth to sixth transistors Q4 to Q6 as in FIG. 4. The fourth to sixth transistors Q4 to Q6 are all NMOS transistors. The source of the sixth transistor Q6 serving as a current source is connected to the ground node.

As described above, the semiconductor circuit 1h of FIG. 13 is different from that of FIG. 4 in that the first to sixth transistors Q1 to Q6 are all configured with NMOS transistors. However, the on/off timing of the first to third transistors Q1 to Q3 is identical to that of FIG. 12.

Figure 14:
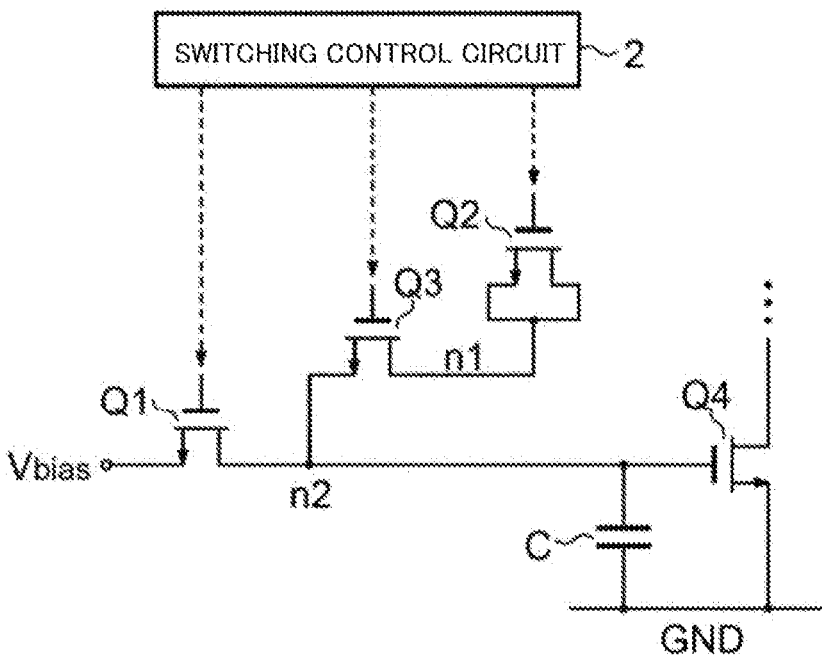
FIG. 14 is a circuit diagram of a semiconductor circuit according to a second modification example of the second embodiment.

FIG. 14 is a circuit diagram of a semiconductor circuit 1i according to a second modification example of the second embodiment. The semiconductor circuit 1i in FIG. 14 is different from the semiconductor circuit 1g in FIG. 11 in the connection point of the second transistor Q2. In the semiconductor circuit 1i of FIG. 14, the drain of the first transistor Q1 and the source of the third transistor Q3 are connected to the second node n2. The second node n2 is also connected to the gate of the fourth transistor Q4 and one end of the hold capacitor C. The drain of the third transistor Q3 is connected to the first node n1 to which the source and the drain of the second transistor Q2 are connected. Also in the semiconductor circuit 1i of FIG. 14, the first to fourth transistors Q1 to Q4 are NMOS transistors.

The third transistor Q3 is caused to make a transition from an on-state to an off-state after the second transistor Q2 makes a transition from an off-state to an on-state, so that a capacitor provided between the source and the drain of the second transistor Q2 and the power-supply voltage node Vdd can be shut off from the gate of the fourth transistor Q4. Thus, a voltage between the gate and the source of the fourth transistor Q4 is not affected by fluctuations in power supply voltage.

Figure 15:
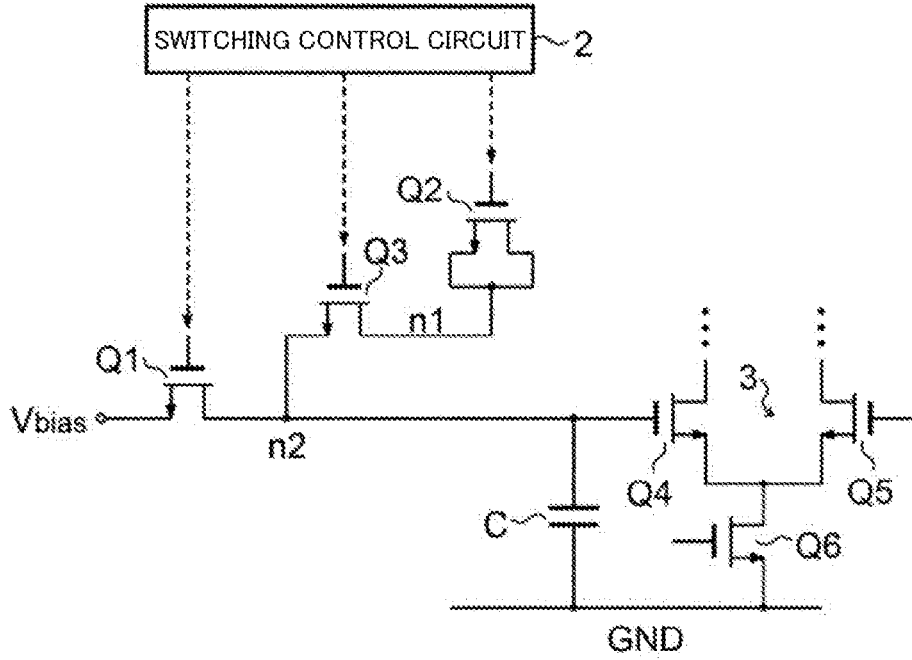
FIG. 15 is a circuit diagram of a semiconductor circuit according to a third modification example of the second embodiment.

FIG. 15 is a circuit diagram of a semiconductor circuit 1j according to a third modification example of the second embodiment. The semiconductor circuit 1j in FIG. 15 is configured such that the fourth transistor Q4 in the semiconductor circuit 1i of FIG. 14 is replaced with the differential amplifier 3 configured as in FIG. 13. The first to sixth transistors Q1 to Q6 of FIG. 15 are all NMOS transistors that obtain the same effect as the semiconductor circuit 1i of FIG. 14.

Figure 16:
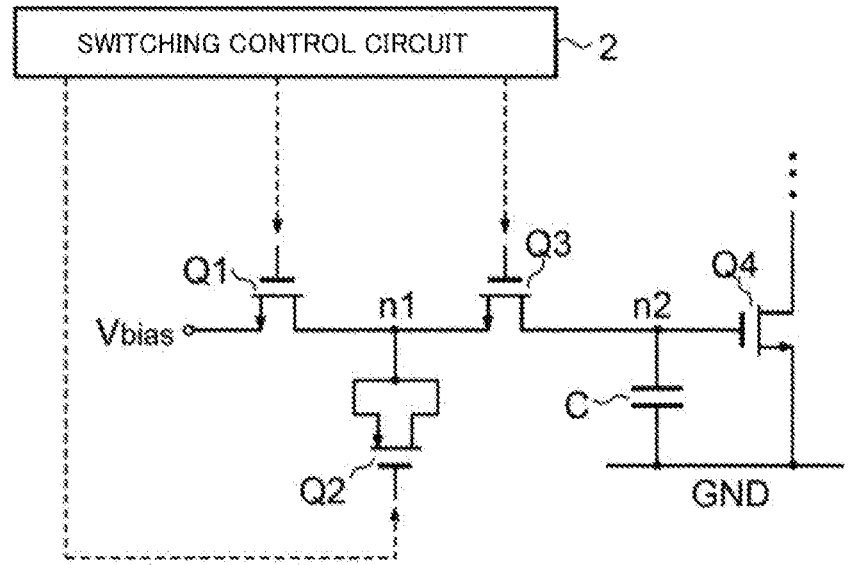
FIG. 16 is a circuit diagram of a semiconductor circuit according to a fourth modification example of the second embodiment.
Figure 17:
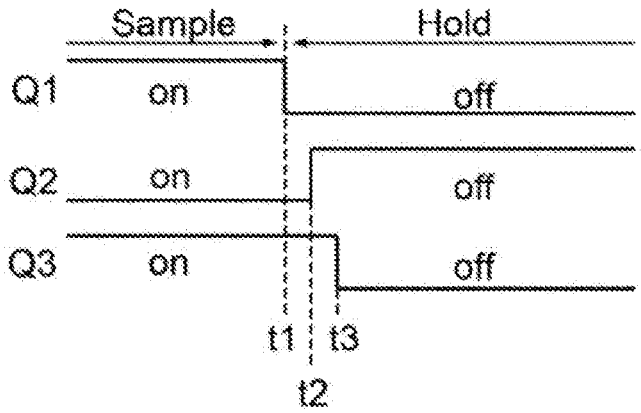
FIG. 17 is an operation timing chart of the semiconductor circuit of FIG. 16.

FIG. 16 is a circuit diagram of a semiconductor circuit 1k according to a fourth modification example of the second embodiment. FIG. 17 is an operation timing chart of the semiconductor circuit 1k in FIG. 16. The semiconductor circuit 1k in FIG. 16 is configured such that the second transistor Q2 in the semiconductor circuit 1g of FIG. 11 is a PMOS transistor. Thus, the operation timing chart of FIG. 17 is identical to that of FIG. 12. The gate waveform of the first transistor Q1 and the gate waveform of the second transistor Q2 are opposite in phase, thereby suppressing potential fluctuations of the first node n1, the potential fluctuations being caused by charge injection and clock feedthrough.

The semiconductor circuit 1k of FIG. 16 has a configuration in common with the semiconductor circuit 1g of FIG. 11 except that the conductivity type of the second transistor Q2 is reversed from that of the semiconductor circuit 1g of FIG. 11. Also in the semiconductor circuit 1k of FIG. 16, a voltage between the gate and the source of the fourth transistor Q4 is not affected by fluctuations of the power supply voltage.

Figure 18:
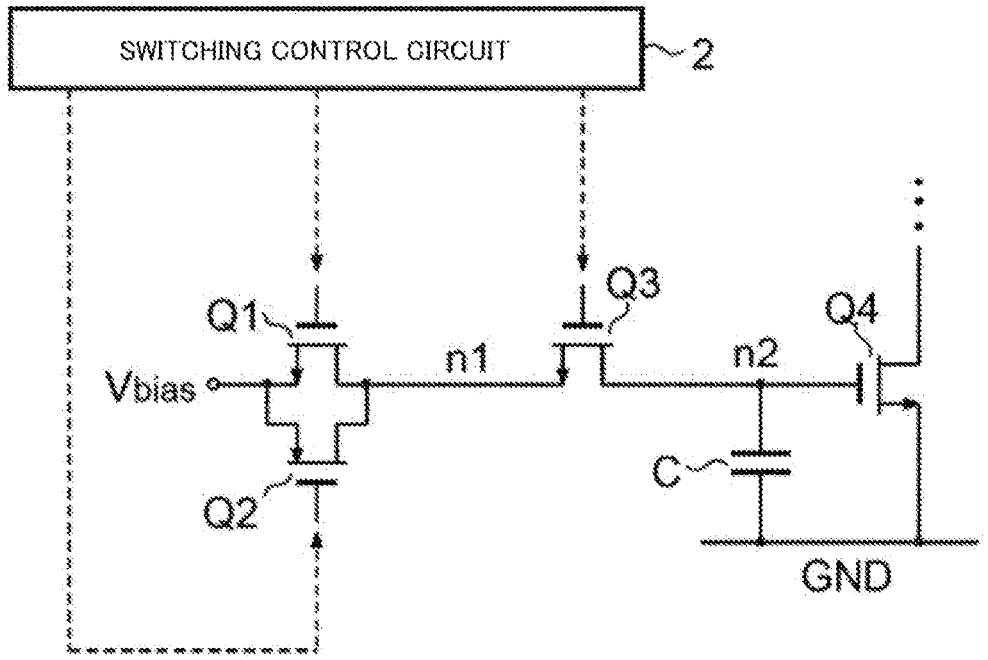
FIG. 18 is a circuit diagram of a semiconductor circuit according to a fifth modification example of a third embodiment.

FIG. 18 is a circuit diagram of a semiconductor circuit 1m according to a fifth modification example of the third embodiment. The semiconductor circuit 1m of FIG. 18 is configured such that the second transistor Q2 is a PMOS transistor and other transistors are NMOS transistors as in the semiconductor circuit 1k of FIG. 16. In FIG. 18, the first transistor Q1 and the second transistor Q2 are connected in parallel between the input node of the bias voltage Vbias and the first node n1. In other words, the sources of the first transistor Q1 and the second transistor Q2 are connected to each other, and the drains thereof are connected to each other.

The second transistor Q2 is caused to make a transition from an off-state to an on-state after the first transistor Q1 is caused to make a transition from an on-state to an off-state, so that an electron ejected from the channel in an off-state of the first transistor Q1 and a positive hole ejected from the channel in an off-state of the second transistor Q2 can be cancelled out. The provision of the third transistor Q3 can obtain the same effect as the semiconductor circuit 1k of FIG. 16.

Figure 19:
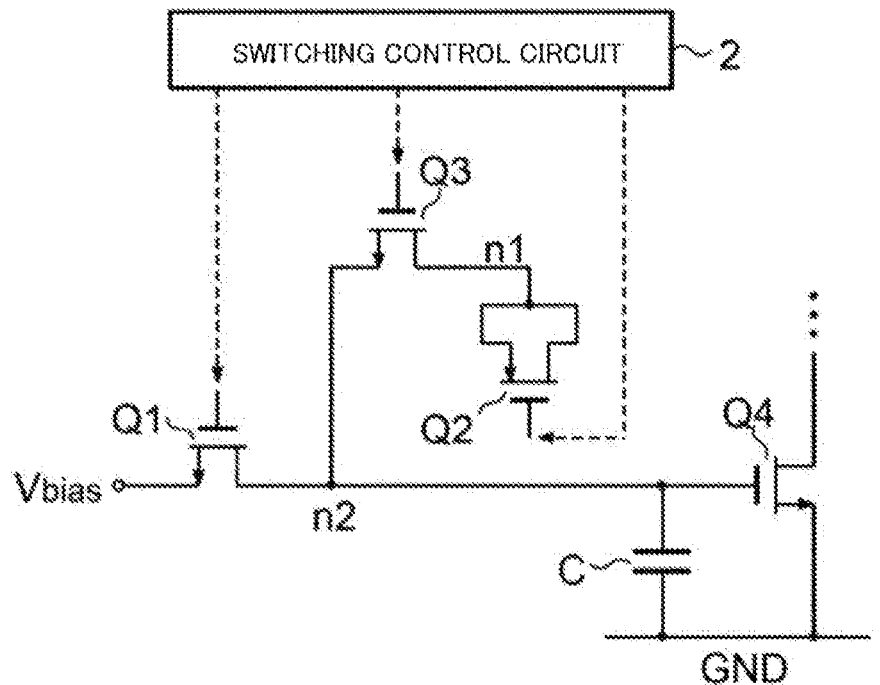
FIG. 19 is a circuit diagram of a semiconductor circuit according to a sixth modification example of the third embodiment.

FIG. 19 is a circuit diagram of a semiconductor circuit 1n according to a sixth modification example of the third embodiment. The semiconductor circuit 1n in FIG. 19 is configured such that the second transistor Q2 in the semiconductor circuit 1i of FIG. 14 is replaced with a PMOS transistor. Although the second transistor Q2 has a gate voltage in opposite phase to FIG. 14, the semiconductor circuit 1n has the operation timing in common with the semiconductor circuit 1i and obtains the same effect.

Third Embodiment

The semiconductor circuits 1 to 1n according to the first and second embodiments can be applied to various devices. An imaging device including the semiconductor circuits 1 to 1n according to the first and second embodiments will be described below.

Figure 20:
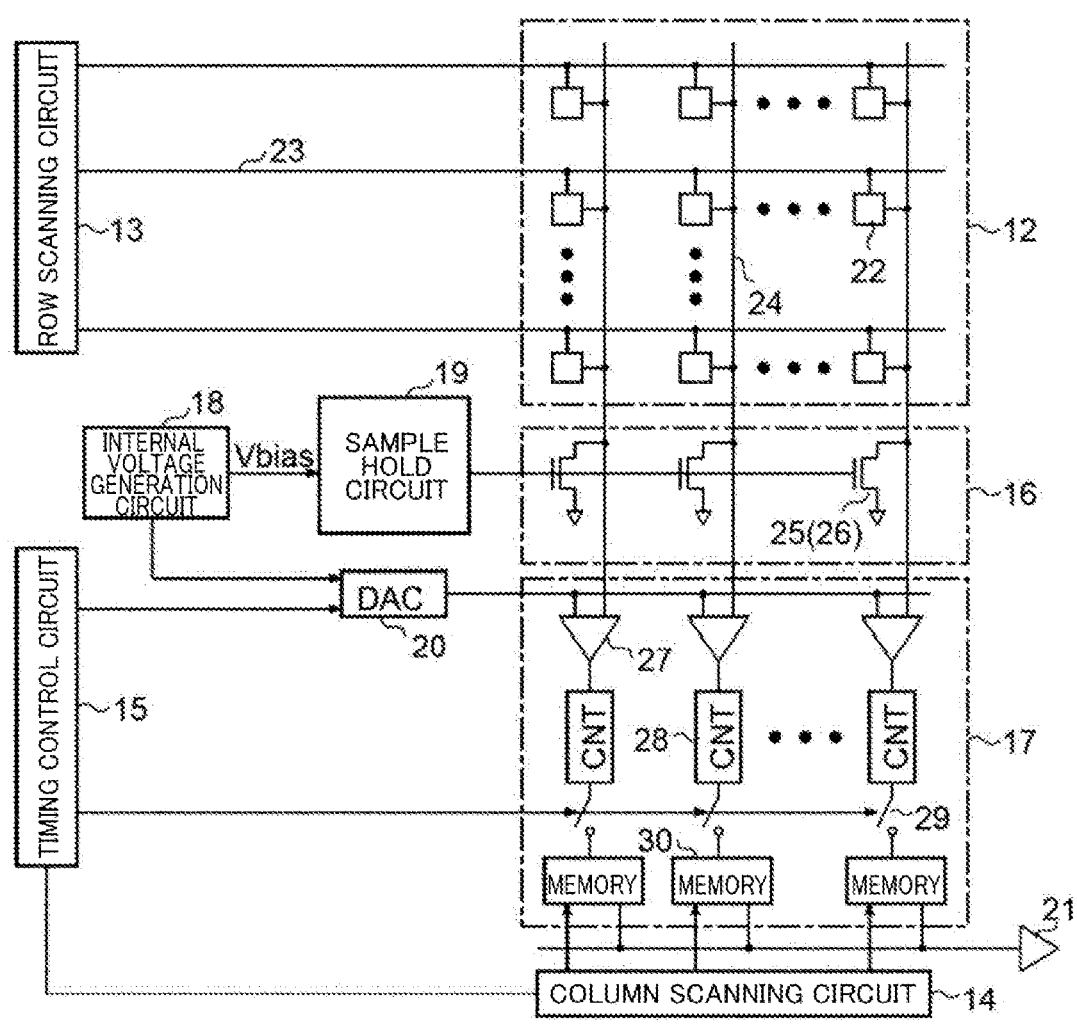
FIG. 20 is a block diagram illustrating a schematic configuration of an imaging device.

FIG. 20 is a block diagram illustrating a schematic configuration of an imaging device 11. The imaging device 11 of FIG. 20 includes a pixel array part 12, a row scanning circuit 13, a column scanning circuit 14, a timing control circuit 15, a load circuit 16, an AD conversion unit 17, an internal voltage generation circuit 18, a sample hold circuit 19, a DA converter (hereinafter, DAC) 20, and an output amplifier 21.

The pixel array part 12 includes a plurality of two-dimensionally arranged pixels 22, a plurality of row drive wires 23 arranged in the row direction, and a plurality of signal lines 24 arranged in the column direction.

The row scanning circuit 13 sets the driving timing of the plurality of row drive wires 23. The load circuit 16 includes a plurality of current sources 25 connected to the plurality of signal lines 24. The current sources 25 constitute a source follower circuit with a pixel 22 transistor in each of the pixels 22. Each of the current sources 25 includes a transistor 26. The transistor 26 corresponds to the fourth transistor Q4 illustrated in, for example, FIG. 1. The drain of the transistor 26 is connected to the corresponding signal line 24 while the source of the transistor 26 is grounded.

The sample hold circuit 19 is connected to the load circuit 16. The sample hold circuit 19 includes first to third transistors Q1 to Q3 and a hold capacitor C that are illustrated in, for example, FIG. 1.

A bias voltage Vbias from the internal voltage generation circuit 18 is supplied to the sample hold circuit 19. Even if the voltage level of the bias voltage Vbias outputted from the internal voltage generation circuit 18 fluctuates due to the influence of power supply noise or the like, the bias voltage Vbias that is sampled and held in the sample hold circuit 19 is supplied to the load circuit 16, thereby eliminating the influence of fluctuations in the voltage level of the bias voltage Vbias from the internal voltage generation circuit 18.

The AD conversion unit 17 includes, for each of the plurality of signal lines 24, a comparator 27, a counter (CNT) 28, a transfer switch 29, and a memory 30. The comparator 27 compares a signal line voltage on the corresponding signal line 24 and a ramp wave voltage outputted from the DAC 20 and detects timing when the signal line voltage crosses the ramp wave voltage. The counter 28 continues a counting operation until the signal line voltage crosses the ramp wave voltage, and stops the counting operation when the signal line voltage crosses the ramp wave voltage. The count value of the counter 28 is stored as a digital signal in the memory 30 in synchronization with the switching timing of the transfer switch 29.

The column scanning circuit 14 performs control to sequentially read digital signals stored in the plurality of memories 30 for the plurality of signal lines 24. The digital signals read from the memories 30 are outputted through the output amplifier 21. The timing control circuit 15 controls the timing of the DAC 20 and the transfer switches 29 or the like.

As described above, the semiconductor circuits 1 to 1$n$ according to the first or second embodiment are applied to the sample hold circuit 19 that generates the bias voltage Vbias supplied to the gates of the transistors 26 of the current sources 25 connected to the signal lines 24, so that variations in current passing through the plurality of current sources 25 can be suppressed to improve the quality of pixel 22 signals on the plurality of signal lines 24.

The third embodiment described an example in which the semiconductor circuits 1 to 1$n$ according to the first and second embodiments are applied to the imaging device 11. The semiconductor circuits 1 to 1$n$ according to the first and second embodiments are applicable to various electronic devices other than the imaging device 11.

<Example of Application to Mobile Object>

The technique of the present disclosure (the present technique) can be applied to various products. For example, the technique according to the present disclosure may be realized as a device mounted on any type of mobile objects such as an automobile, an electric automobile, a hybrid electric automobile, a motorcycle, a bicycle, a personal mobility device, an airplane, a drone, a ship, and a robot.

Figure 21:
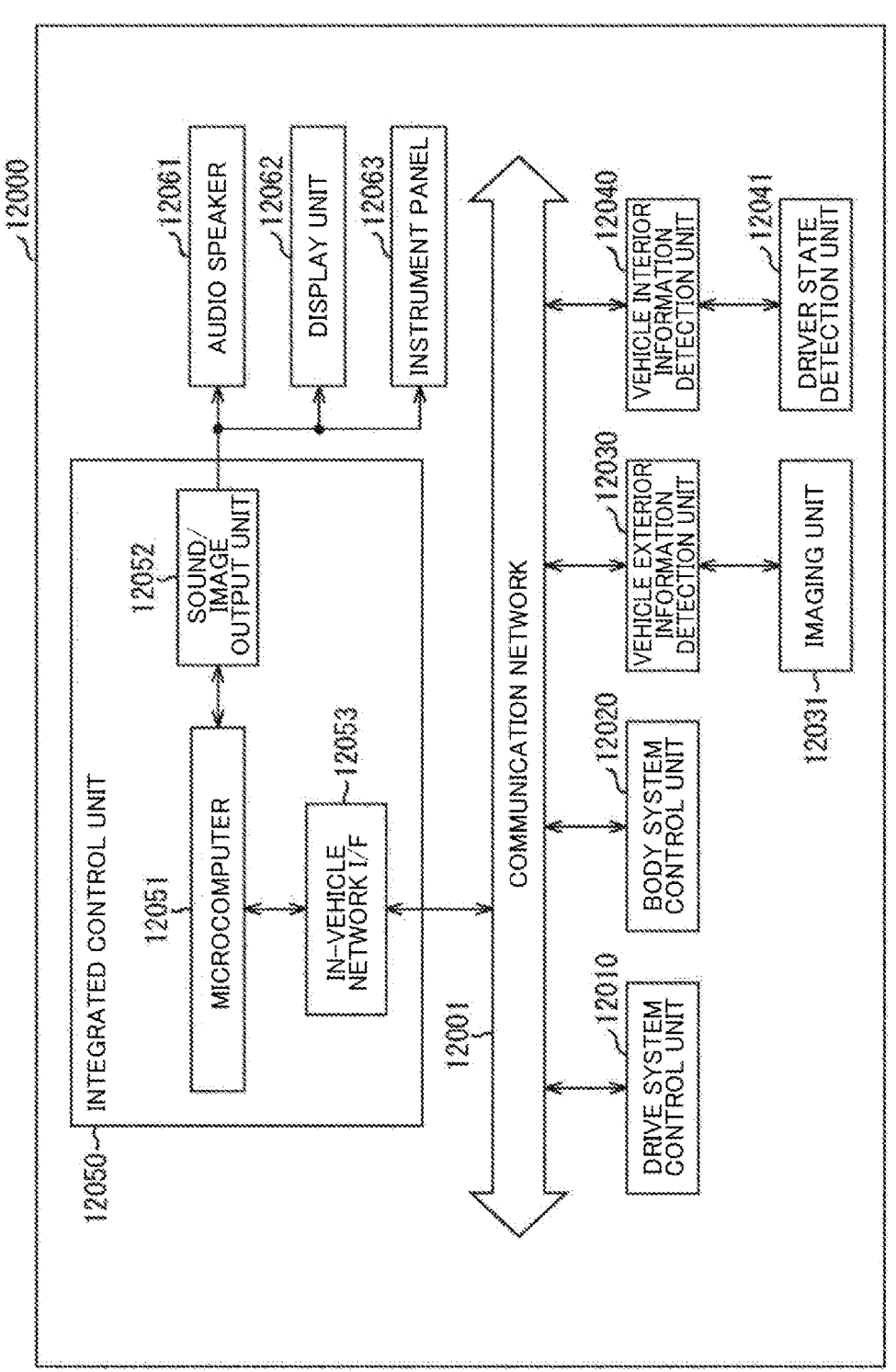
FIG. 21 is a block diagram illustrating an example of a schematic configuration of a vehicle control system.

FIG. 21 is a block diagram showing a schematic configuration example of a vehicle control system that is an example of a mobile object control system to which the technique according to the present disclosure can be applied.

A vehicle control system 12000 includes a plurality of electronic control units connected to one another via a communication network 12001. In the example illustrated in FIG. 21, the vehicle control system 12000 includes a drive system control unit 12010, a body system control unit 12020, a vehicle exterior information detection unit 12030, a vehicle interior information detection unit 12040, and an integrated control unit 12050. A microcomputer 12051, a sound/image output unit 12052, and an in-vehicle network I/F (Interface) 12053 are illustrated as the functional configuration of the integrated control unit 12050.

The drive system control unit 12010 controls an operation of an apparatus related to the drive system of a vehicle according to various programs. For example, the drive system control unit 12010 functions as a driving force generator for generating a vehicle driving force of an internal combustion engine or a driving motor, a driving force transmission mechanism for transmitting a driving force to wheels, a steering mechanism for adjusting a turning angle of a vehicle, and the control unit of a braking device that generates a braking force of a vehicle.

The body system control unit 12020 controls operations of various devices mounted in a vehicle body according to various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be inputted to the body system control unit 12020. The body system control unit 12020 receives the inputs of the radio waves or signals and controls a door lock device, a power window device, and a lamp or the like of the vehicle.

The vehicle exterior information detection unit 12030 detects information on the outside of the vehicle having the vehicle control system 12000 mounted thereon. For example, an imaging unit 12031 is connected to the vehicle exterior information detection unit 12030. The vehicle exterior information detection unit 12030 causes the imaging unit 12031 to capture an image outside of the vehicle and receives the captured image. The vehicle exterior information detection unit 12030 may perform object detection or distance detection of persons, cars, obstacles, signs, or letters on the road on the basis of the received image.

The imaging unit 12031 is an optical sensor that receives light and outputs an electrical signal according to the amount of received light. The imaging unit 12031 can also output the electrical signal as an image or distance measurement information. In addition, the light received by the imaging unit 12031 may be visible light or invisible light such as infrared light.

The vehicle interior information detection unit 12040 detects information on the inside of the vehicle. For example, a driver state detection unit 12041 that detects a state of a driver is connected to the vehicle interior information detection unit 12040. The driver state detection unit 12041 includes, for example, a camera that captures an image of a driver. The vehicle interior information detection unit 12040 may calculate a degree of fatigue or concentration of the driver or may determine whether or not the driver is dozing, on the basis of detection information inputted from the driver state detection unit 12041.

The microcomputer 12051 can calculate control target values for the driving force generation device, the steering mechanism, or the braking device on the basis of vehicle interior or exterior information obtained by the vehicle exterior information detection unit 12030 or the vehicle interior information detection unit 12040, and output control commands to the drive system control unit 12010. For example, the microcomputer 12051 can perform coordinated control for the purpose of implementing functions of an ADAS (Advanced Driver Assistance System) including vehicle collision avoidance, impact mitigation, following traveling based on an inter-vehicle distance, constant vehicle speed driving, vehicle collision warnings, and lane departure warning.

Furthermore, the microcomputer 12051 can perform cooperative control for the purpose of, for example, automated driving in which the vehicle travels in an automated manner without depending upon operations by the driver, by controlling the driving force generator, the steering mechanism, or the braking device or the like on the basis of information about the surroundings of the vehicle, the information being acquired by the vehicle exterior information detection unit 12030 or the vehicle interior information detection unit 12040.

In addition, the microcomputer 12051 can output a control command to the body system control unit 12030 on the basis of information outside of the vehicle, the information being acquired by the vehicle exterior information detection unit 12030. For example, the microcomputer 12051 can perform coordinated control for preventing glare, for example, switching of a high beam to a low beam by controlling a headlamp according to a position of a vehicle ahead or an oncoming vehicle that is detected by the vehicle exterior information detection unit 12030.

The sound/image output unit 12052 transmits an output signal of at least one of a sound and an image to an output device capable of visually or audibly notifying a passenger or the outside of the vehicle of information. In the example of FIG. 21, an audio speaker 12061, a display unit 12062, and an instrument panel 12063 are shown as examples of the output device. The display unit 12062 may include, for example, at least one of an on-board display and a head-up display.

Figure 22:
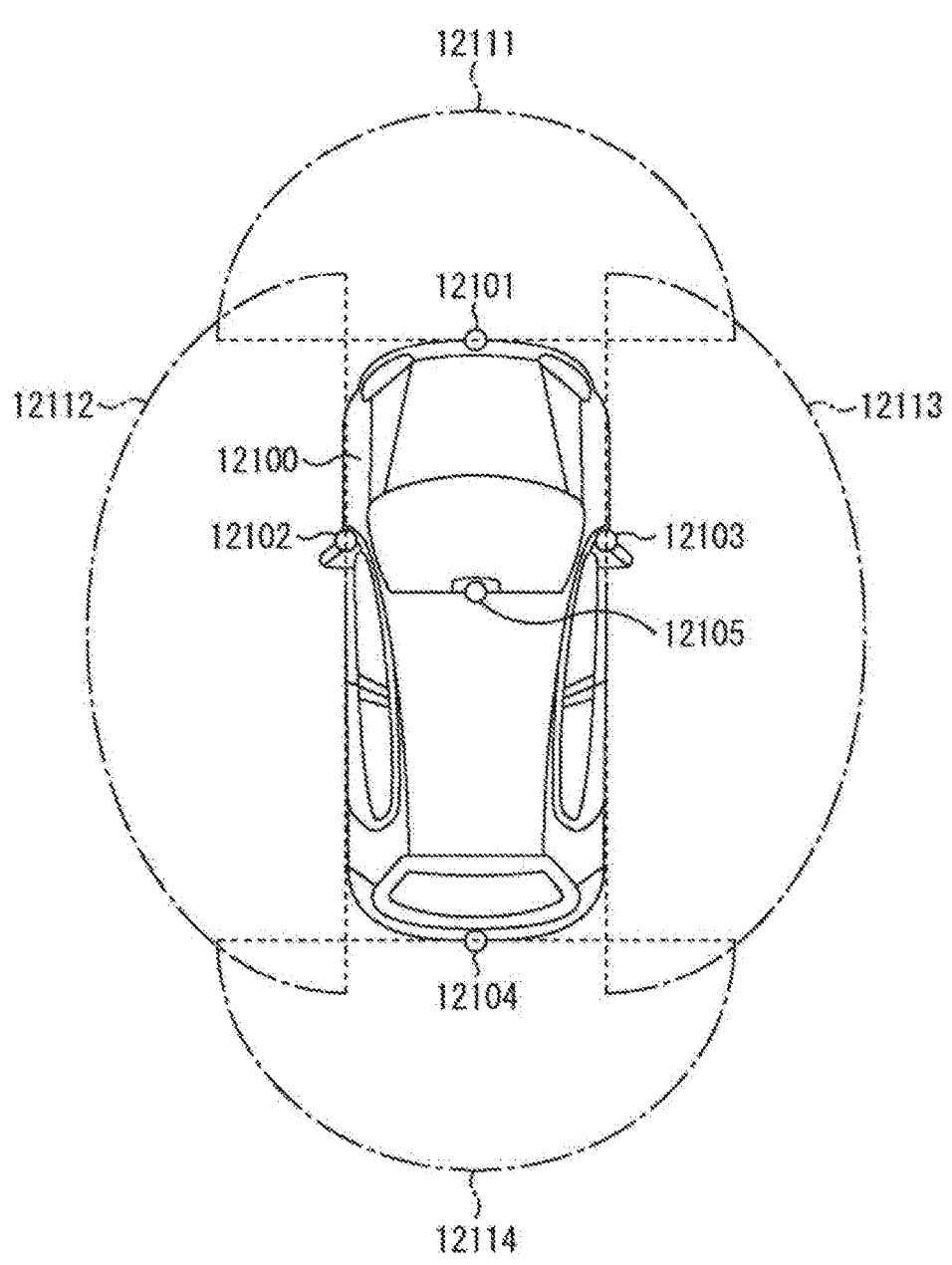
FIG. 22 is an explanatory drawing illustrating an example of the installation positions of a vehicle exterior information detection unit and imaging units.

FIG. 22 illustrates an example of the installation position of the imaging unit 12031.

In FIG. 22, the imaging unit 12031 includes imaging units 12101, 12102, 12103, 12104, and 12105.

The imaging units 12101, 12102, 12103, 12104, and 12105 are provided at, for example, the positions of the front nose, the side mirrors, the rear bumper, the back door, and the upper portion of the vehicle internal front windshield of the vehicle 12100. The imaging unit 12101 provided at the front nose and the imaging unit 12105 provided at an upper portion of the vehicle internal front windshield mainly acquire images ahead of the vehicle 12100. The imaging units 12102 and 12103 provided at the side mirrors mainly acquire images on the sides of the vehicle 12100. The imaging unit 12104 provided at the rear bumper or the back door mainly acquires an image behind the vehicle 12100. The imaging unit 12105 included in the upper portion of the windshield inside of the vehicle is mainly used for detecting a vehicle ahead, a pedestrian, an obstacle, a traffic signal, a traffic sign, and a lane or the like.

FIG. 22 illustrates an example of the imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, by superimposing image data captured by the imaging units 12101 to 12104, a bird's-eye view image viewed from the upper side of the vehicle 12100 can be obtained.

At least one of the imaging units 12101 to 12104 may have the function of obtaining distance information. For example, at least one of the imaging units 12101 to 12104 may be a stereo camera including a plurality of imaging elements or may be an imaging element that has pixels for phase difference detection.

For example, the microcomputer 12051 can extract, particularly, a closest three-dimensional object on the traveling path of the vehicle 12100, which is a three-dimensional object traveling at a predetermined speed (for example, 0 km/h or higher) in the substantially same direction as the vehicle 12100, as a vehicle ahead by obtaining a distance to each three-dimensional object in the imaging ranges 12111 to 12114 and a temporal change of the distance (a relative speed with respect to the vehicle 12100) based on distance information obtained from the imaging units 12101 to 12104. The microcomputer 12051 can also set a distance to be secured from a vehicle ahead and perform, for example, automatic brake control (including following stop control) and automatic acceleration control (including following start control). In this way, coordinated control can be performed for the purpose of, for example, automated driving in which the vehicle travels in an automated manner without depending upon operations by the driver.

For example, the microcomputer 12051 can classify and extract three-dimensional data regarding three-dimensional objects into two-wheeled vehicles, standard-sized vehicles, large-sized vehicles, pedestrians, and other three-dimensional objects such as electric poles on the basis of distance information obtained from the imaging units 12101 to 12104 and can use the three-dimensional data for automated avoidance of obstacles. For example, the microcomputer 12051 distinguishes obstacles around the vehicle 12100 into obstacles visually recognizable by the driver of the vehicle 12100 and obstacles difficult to visually recognize. Thereafter, the microcomputer 12051 determines a collision risk indicating the degree of risk of collision with each obstacle, and when the collision risk is equal to or higher than a set value and there is a possibility of collision, an alarm is outputted to the driver through the audio speaker 12061 or the display unit 12062, forced deceleration or avoidance steering is performed through the drive system control unit 12010, thereby providing driving support for collision avoidance.

At least one of the imaging units 12101 to 12104 may be an infrared camera that detects infrared rays. For example, the microcomputer 12051 can recognize a pedestrian by determining the presence or absence of a pedestrian in captured images of the imaging units 12101 to 12104. A pedestrian is recognized by, for example, the step of extracting feature points in the captured images of the imaging units 12101 to 12104 serving as infrared cameras and the step of performing pattern matching on a series of feature points indicating an outline of an object to determine whether the object is a pedestrian. When the microcomputer 12051 determines the presence of a pedestrian in the captured images of the imaging units 12101 to 12104 and the pedestrian is recognized, the sound/image output unit 12052 controls the display unit 12062 such that a square contour line for emphasis is displayed to be superimposed on the recognized pedestrian. In addition, the sound/image output unit 12052 may control the display unit 12062 such that an icon indicating a pedestrian is displayed at a desired position.

An example of the vehicle control system to which the technique according to the present disclosure is applicable was described above. The technique according to the present disclosure is applicable to the imaging unit 12031 or the like among the above-described configurations. Specifically, the imaging device 11 of the present disclosure is applicable to the imaging unit 12031. By applying the technique according to the present disclosure to the imaging unit 12031, an image can be more clearly captured, thereby reducing driver fatigue.

The present technique can be configured as follows:

(1) A semiconductor circuit including: a first transistor that switches whether to acquire an input signal into a first node;

a second transistor having at least one of the source and the drain that are connected to the first node; and a third transistor that switches whether the first node and a second node are to be electrically short-circuited or cut off from each other, wherein the state of the second transistor makes a transition to have a gate waveform opposite in phase to the gate waveform of the first transistor after the timing of a transition of the first transistor from an on-state to an off-state, and the third transistor makes a transition from an on-state to an off-state after the timing of the state transition of the second transistor.

(2) The semiconductor device according to (1), further including a cancelling switch that includes the second transistor and cancels potential fluctuations of the first node, the potential fluctuations being caused by charge injection and clock feedthrough when the first transistor makes a transition from an on-state to an off-state.

(3) The semiconductor circuit according to (1) or (2), wherein the drain of the first transistor is connected to the first node, and the input signal is inputted to the source of the first transistor.

(4) The semiconductor circuit according to (3), wherein the first transistor and the third transistor are PMOS (P-channel Metal-Oxide-Semiconductor) transistors, if the second transistor is a PMOS transistor, the second transistor may make a transition from an off-state to an on-state after the timing of the transition of the first transistor from the on-state to the off-state, and the third transistor may make a transition from an on-state to an off-state after the timing of the transition of the second transistor from the off-state to the on-state, and if the second transistor is an NMOS (N-channel Metal-Oxide-Semiconductor) transistor, the second transistor makes a transition from an on-state to an off-state after the timing of the transition of the first transistor from the on-state to the off-state, and the third transistor makes the transition from the on-state to the off-state after the timing of a transition of the second transistor from the on-state to the off-state.

(5) The semiconductor circuit according to (1) or (2), wherein the drain of the first transistor is connected to the second node, and the input signal is inputted to the source of the first transistor.

(6) The semiconductor circuit according to (5), wherein the first transistor and the third transistor are NMOS (N-channel Metal-Oxide-Semiconductor) transistors, if the second transistor is a NMOS transistor, the second transistor may make a transition from an off-state to an on-state after the timing of the transition of the first transistor from the on-state to the off-state, and the third transistor may make the transition from the on-state to the off-state after the timing of a transition of the second transistor from the off-state to the on-state, and if the second transistor is a PMOS transistor, the second transistor makes a transition from an on-state to an off-state after the timing of a transition of the first transistor from an on-state to an off-state, and the third transistor makes a transition from an on-state to an off-state after the timing of a transition of the second transistor from an on-state to an off-state.

(7) The semiconductor circuit according to any one of (1) to (6), wherein after the third transistor makes a transition from an on-state to an off-state, the second node is set at a potential independent of the gate potential of the second transistor.

(8) The semiconductor circuit according to any one of (1) to (7), further including a fourth transistor having the gate connected to the second node, and a capacitor connected between the gate of the fourth transistor and a reference potential node.

(9) The semiconductor circuit according to (8), wherein the capacitor holds a charge corresponding to the input signal at the timing of a transition of the first transistor from an on-state to an off-state.

(10) The semiconductor circuit according to (8) or (9), wherein the capacitor is connected between the second node and the third node, and when the third transistor is turned off, the gate potential of the third transistor is set at the potential of the third node.

(11) The semiconductor circuit according to (8) or (9), wherein the source of the fourth transistor is connected to a signal line that transmits a pixel signal.

(12) The semiconductor circuit according to (8) or (9), further including a current source including the fourth transistor.

The semiconductor circuit according to (8) or (9), further including a differential amplifier including:

a fifth transistor constituting a differential pair with the fourth transistor, and a sixth transistor that controls a current applied between the drains and sources of the fourth transistor and the fifth transistor.

(14) The semiconductor circuit according to any one of (1) to (13), wherein the first transistor, the second transistor, and the third transistor have the same conductivity type.

(15) The semiconductor circuit according to any one of (1) to (13), wherein the conductivity type of the first transistor and the third transistor and the conductivity type of the second transistor are different from each other.

(16) The semiconductor circuit according to (15), wherein the sources of the first transistor and the second transistor are connected to each other, and the drains of the first transistor and the second transistor are connected to each other.

(17) The semiconductor circuit according to any one of (1) to (16), further including a switching control circuit that causes the second transistor to make a transition from an off-state to an on-state after the timing of the transition of the first transistor from the on-state to the off-state, and the switching control circuit causes the third transistor to make a transition from an on-state to an off-state after the timing of the state transition of the second transistor.

(18) An imaging device including: a pixel array part configured such that a plurality of pixels having a plurality of photoelectric conversion units are two-dimensionally arranged;

a plurality of signal lines that transmit pixel signals photoelectrically converted in the plurality of pixels in the pixel array part;

an internal voltage generation circuit that generates a bias voltage;

a sample hold circuit that samples and holds the bias voltage with a predetermined period;

a current source that controls a current passing through the plurality of signal lines, on the basis of the bias voltage held by the sample hold circuit; and an AD converter that generates a plurality of digital signals corresponding to the plurality of pixel signals on the basis of the results of comparison between the pixel signals on the plurality of signal lines and a reference signal, the sample hold circuit including:

a first transistor that switches whether to acquire an the bias voltage into a first node;

a second transistor having the source and the drain that are connected to the first node;

a third transistor that switches whether the first node and a second node are to be electrically short-circuited or cut off from each other;

The semiconductor circuit may include a fourth transistor having the gate connected to the second node; and a capacitor connected between the gate and the source of the fourth transistor, wherein the second transistor makes a transition from an off-state to an on-state after the timing of a transition of the first transistor from an on-state to an off-state, and the third transistor makes a transition from an on-state to an off-state after the timing of a transition of the second transistor from an off-state to an on-state.

(19) The imaging device according to (18), wherein the current source includes a plurality of fourth transistors corresponding to the plurality of signal lines, and the drains of the plurality of fourth transistors are connected to the respective signal lines.

(20) An electronic device including: the imaging device according to (18) or (19); and a signal processing unit that performs signal processing on the basis of the plurality of digital signals outputted from the imaging device.

Aspects of the present disclosure are not limited to the aforementioned individual embodiments and include various modifications that those skilled in the art can achieve, and effects of the present disclosure are also not limited to the details described above. In other words, various additions, modifications, and partial deletion can be made without departing from the conceptual idea and the gist of the present disclosure that can be derived from the details defined in the claims and the equivalents thereof.

REFERENCE SIGNS LIST 1, 1a, 1b, 1c, 1d, 1e, 1f, 1g, 1h, 1i, 1j, 1k, 1m, 1n Semiconductor circuit
3 Differential amplifier
11 Imaging device
12 Pixel array part
13 Row scanning circuit
14 Column scanning circuit
15 Timing control circuit
16 Load circuit
17 AD conversion unit
18 Internal voltage generation circuit
19 Sample hold circuit
20 Converter (hereinafter, DAC)
21 Output amplifier
22 Pixel
23 Row drive wire
24 Signal line
25 Current source
26 Transistor
27 Comparator
28 Counter (CNT)

28 Counter
29 Transfer switch
30 Memory

The invention claimed is:

1. A semiconductor circuit, comprising:

a first transistor connected to a first node, wherein the first transistor is configured to:

transition from an on-state to an off-state; and control transmission of an input signal to the first node based on the transition of the first transistor from the on-state to the off-state;

a second transistor configured to switch between an off-state and an on-state, wherein the second transistor includes a source and a drain, and each of the source of the second transistor and the drain of the second transistor is connected to the first node; and a third transistor configured to transition from an on-state to an off-state, wherein the third transistor includes a source and a drain, the source of the third transistor is connected to the first node, the drain of the third transistor is connected to a second node, the second node is different from the first node, based on the transition of the third transistor from the on-state to the off-state, the first node is one of electrically short circuit from the second node or electrically cut off from the second node, the switch of the second transistor between the on-state and the off-state is associated with a gate waveform of the second transistor, the gate waveform of the second transistor is opposite in phase to a gate waveform of the first transistor at a first time period, the first time period is a time period after the transition of the first transistor from the on-state to the off-state, the transition of the third transistor from the on-state to the off-state after timing of is at a second time period, and the second time period is a time period after the switch of the second transistor between the off-state and the on-state.

2. The semiconductor circuit according to claim 1, further comprising a cancelling switch that includes the second transistor, wherein the second transistor is further configured to cancel potential fluctuations of the first node, and the potential fluctuations are based on charge injection and clock feedthrough at a time of the transition of the first transistor from the on-state to the off-state.

3. The semiconductor circuit according to claim 1, wherein the first transistor includes a drain and a source, the drain of the first transistor is connected to the first node, and the source of the first transistor is configured to receive the input signal.

4. The semiconductor circuit according to claim 3, wherein each of the first transistor and the third transistor is a PMOS (P-channel Metal-Oxide-Semiconductor) transistor, the second transistor is one of the PMOS transistor or an NMOS (N-channel Metal-Oxide-Semiconductor) transistor, based on the second transistor is the PMOS transistor, the second transistor is further configured to transition from the off-state to the on-state at the first time period, and the third transistor is further configured to transition from the on-state to the off-state at the second time period, and based on the second transistor is the NMOS transistor, the second transistor is further configured to transition from the on-state to the off-state at the first time period, and the third transistor is further configured to transition from the on-state to the off-state at the second time period.

5. The semiconductor circuit according to claim 1, wherein the first transistor includes a drain and a source, the drain of the first transistor is connected to the second node, and the source of the first transistor is configured to receive the input signal.

6. The semiconductor circuit according to claim 5, wherein each of the first transistor and the third transistor is an NMOS (N-channel Metal-Oxide-Semiconductor) transistor, the second transistor is one of the NMOS transistor or a PMOS (P-channel Metal-Oxide-Semiconductor), based on the second transistor is the NMOS transistor, the second transistor is further configured to transition from the off-state to the on-state at the first time period, and the third transistor is further configured to transition from the on-state to the off-state at the second time period, and based on the second transistor is the PMOS transistor, the second transistor is further configured to transition from the on-state to the off-state at the first time period, and the third transistor is further configured to transition from the on-state to the off-state at the second time period.

7. The semiconductor circuit according to claim 1, wherein the second node, after the transition of the third transistor form the on-state to the off-state, is at a specific potential, and the specific potential is independent of a gate potential of the second transistor.

8. The semiconductor circuit according to claim 1, further comprising:

a fourth transistor includes a drain, a source, and a gate, wherein the gate of the fourth transistor is connected to the second node; and a capacitor connected between the gate of the fourth transistor and a reference potential node, wherein the reference potential node is different from each of the first node and the second node.

9. The semiconductor circuit according to claim 8, wherein the capacitor is configured to store a charge corresponding to the input signal at a time of the transition of the first transistor from the on-state to the off-state.

10. The semiconductor circuit according to claim 8, wherein the capacitor is connected between the second node and a third node, the third node is different from the each of the first node and the second node, and a gate potential of the third transistor is at a potential of the third node, based on the third transistor is in the off-state.

11. The semiconductor circuit according to claim 8, wherein the fourth transistor further includes a source, the source of the fourth transistor is connected to a signal line, and the signal line is configured to transmit a pixel signal.

12. The semiconductor circuit according to claim 8, further comprising a current source that includes the fourth transistor.

13. The semiconductor circuit according to claim 8, further comprising a differential amplifier, wherein the differential amplifier includes a fifth transistor and a sixth transistor, the fifth transistor and the fourth transistor are a differential pair, the fifth transistor includes a source and a drain, and the sixth transistor is configured to control a current between each of the drain of the fourth transistor, the drain of the fifth transistor, the source of the fourth transistor, and the source of the fifth transistor.

14. The semiconductor circuit according to claim 1, wherein each of the first transistor, the second transistor, and the third transistor are of a specific conductivity type.

15. The semiconductor circuit according to claim 1, wherein each of the first transistor and the third transistor is of a first conductivity type, the second transistor is of a second conductivity type, and the first conductivity type is different from the second conductivity type.

16. The semiconductor circuit according to claim 15, wherein the first transistor includes a source and a drain, the source of the first transistor is connected to the source of the second transistor, and the drain of the first transistor is connected to the drain of the second transistor.

17. The semiconductor circuit according to claim 1, further comprising a switching control circuit configured to:

control the second transistor to switch between the on-state and the off-state at the first time period; and control the third transistor to transition from the on-state to the off-state at the second time period.

18. An imaging device, comprising:

a pixel array part that includes a plurality of pixels, wherein the plurality of pixels includes a plurality of photoelectric conversion units, and the plurality of photoelectric conversion units is in a two-dimensional array;

a plurality of signal lines configured to transmit a plurality of pixel signals, wherein the plurality of pixels is configured to perform photoelectric conversion on the plurality of pixel signals;

an internal voltage generation circuit configured to generate a bias voltage;

a sample hold circuit configured to sample the bias voltage in a first time period and hold the bias voltage in the first time period;

a current source configured to control a current through the plurality of signal lines based on the held bias voltage; and an AD converter configured to generate, based on a result of comparison between each of the plurality of pixel signals and a reference signal, a plurality of digital signals corresponding to the plurality of pixel signals, wherein the plurality of pixel signals is on the plurality of signal lines, and the sample hold circuit includes:

a first transistor connected to a first node, wherein the first transistor is configured to:

transition from an on-state to an off-state; and control transmission of an input signal to the first node based on the transition of the first transistor from the on-state to the off-state;

a second transistor configured to switch between an off-state and an on-state, wherein the second transistor includes a source and a drain, and each of the source of the second transistor and the drain of the second transistor is connected to the first node; and a third transistor configured to transition from an on-state to an off-state, wherein the third transistor includes a source and a drain, the source of the third transistor is connected to the first node, the drain of the third transistor is connected to a second node, the second node is different from the first node, based on the transition of the third transistor from the on-state to the off-state, the first node is one of electrically short circuit from the second node or electrically cut off from the second node, the switch of the second transistor between the on-state and the off-state is associated with a gate waveform of the second transistor, the gate waveform of the second transistor is opposite in phase to a gate waveform of the first transistor at a second time period, the second time period is a time period after the transition of the first transistor from the on-state to the off-state, the transition of the third transistor from the on-state to the off-state is at a third time period, and the third time period is a time period after the switch of the second transistor between the off-state and the on-state.

19. The imaging device according to claim 18, wherein the current source includes a plurality of transistors corresponding to the plurality of signal lines, each of the first transistor, the second transistor, and the third transistor is different from the plurality of transistors, each of the plurality of transistors includes a respective drain, and the respective drain of the each of the plurality of transistors is connected to a respective signal line of the plurality of signal lines.

20. An electronic device, comprising:

the imaging device according to claim 18, wherein the imaging device is configured to output the plurality of digital signals; and a signal processing unit configured to perform a signal processing process based on the plurality of digital signals.

* * * * *